(12) United States Patent  (10) Patent No.: US 7,924,190 B2
Maruko et al.  (45) Date of Patent: Apr. 12, 2011

(54) ADJUSTBLE GAIN SIGNAL PROCESSING DEVICE

(75) Inventors: Tsuguto Maruko, Tokyo (JP); Naotaka Saito, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/562,645

(22) Filed: Sep. 18, 2009

(65) Prior Publication Data

US 2010/0073213 A1 Mar. 25, 2010

(30) Foreign Application Priority Data

Sep. 25, 2008 (JP) ................. 2008-245813

(51) Int. Cl.
H03M 1/00 (2006.01)
(52) U.S. Cl. ........... 341/139; 341/143; 330/10; 330/251
(58) Field of Classification Search .................. 341/139, 341/152, 155; 330/10, 207 A, 251
See application file for complete search history.

(56) References Cited

U.S. PATENT DOCUMENTS

| 5,815,581 | A * | 9/1998 | Andersson .................... 381/321 |
| 5,917,369 | A * | 6/1999 | Nguyen .......................... 330/10 |
| 6,339,360 | B1 * | 1/2002 | Santillano ....................... 330/10 |
| 6,897,725 | B2 * | 5/2005 | Honda ....................... 330/207 A |
| 7,151,404 | B2 * | 12/2006 | Lee et al. ........................ 330/10 |

FOREIGN PATENT DOCUMENTS

| JP | 2008-017367 | 1/2008 |
| JP | 2010-073213 | 4/2010 |
| JP | 2010-081189 | 4/2010 |

* cited by examiner

Primary Examiner — Khai M Nguyen
(74) Attorney, Agent, or Firm — Taft Stettinius & Hollister LLP

(57) ABSTRACT

A CLK generating section of a digital ALC generates a multiplication clock signal that is obtained by multiplying a triangular wave generated at a triangular wave generating circuit. On the basis of the multiplication clock signal, a signal converting section converts a one-bit digital audio signal outputted from an outputting stage into a multi-bit digital signal, and monitors a voltage value of an input signal. A level controlling section controls a voltage level on the basis of a target level inputted from an exterior of an LSI. On the basis of a control signal inputted from an exterior of the LSI, a volume controlling section outputs, to a PGA, a gain adjusting signal so as to vary a waveform of an input signal.

5 Claims, 9 Drawing Sheets

ADJUSTBLE GAIN SIGNAL PROCESSING DEVICE

CROSS-REFERENCE TO RELATED APPLICATIONS

This application claims priority under 35 U.S.C. §119 from Japanese Patent Application No. 2008-245813 filed on Sep. 25, 2008, the disclosure of which is incorporated by reference herein.

RELATED ART

1. Field of the Invention

The present disclosure relates to a signal processing device that adjusts the gain of an analog audio signal, and outputs a digital audio signal that has been converted into a digital signal.

2. Description of the Related Art

Signal processing system circuits are known that, by a signal processing device such as a semiconductor integrated circuit (LSI) equipped with a class D amplifier, or the like, that amplifies an analog audio signal, converts the amplified signal into a digital audio signal, and output a reconverted analog audio signal to a speaker. FIG. 9 is a schematic structural drawing showing an example of the schematic structure of a conventional signal processing device 100.

The conventional signal processing device (semiconductor integrated circuit) 100 has a pre-amplifier section 112 and a class D amplifier 114. A VCA (Voltage Controlled Amplifier) 120 of the pre-amplifier section 112 amplifies an analog audio signal that is inputted from the exterior, and outputs the amplified signal to the class D amplifier 114. On the basis of the inputted audio signal and a triangular wave generated at a triangular wave generating circuit 124, a comparator (COMP) 122 of the class D amplifier 114 subjects a PWM (Pulse Width Modulation) wave, that has been pulse-width-modulated, to signal processing at a PWM modulator 126. Next, the comparator (COMP) 122 outputs the results of the signal processing from an outputting stage 128 to an external speaker 116. Further, the pre-amplifier section 112 includes a peak hold circuit 130 that monitors the output from the VCA 120. The peak hold circuit 130 detects the peak value of the output from the VCA 120, and adjusts the gain of the VCA 120 by feedback. Due thereto, the peak hold circuit 130 maintains constant the volume of the digital audio signal, outputted from the semiconductor integrated circuit 100.

A large capacity capacitor 132 and resistor 134, that are needed in order to detect the peak value at the peak hold circuit 130, are added as externally-attached parts of the semiconductor integrated circuit 100. Therefore, at the conventional signal processing device (semiconductor integrated circuit) 100, the surface area of the overall signal processing system circuit increases.

Further, at the conventional signal processing device (semiconductor integrated circuit) 100, because the analog signal is controlled by the externally-attached parts, fine control of timings such as the attack time (the time until the gain of the amplifier is lowered to a predetermined level) and the release time (the time until the gain of the amplifier is raised to a predetermined level) and the like was difficult. Moreover, at the conventional signal processing device (semiconductor integrated circuit) 100, because the analog signal is controlled by the externally-attached parts, the surface area of the overall signal processing system circuit increases.

An AGC circuit that controls the gain of the electronic volume is known as a technique that can appropriately set the attack time and the release time without providing an externally-attached circuit (see, for example, Japanese Patent Application Laid-Open (JP-A) No. 2008-017367). The AGC circuit raises or lowers a reference level in accordance with a rise or a fall in an input audio signal, and carries out adjustment so that the gain of the electronic volume becomes a gain that is associated with the reference level.

The technique of aforementioned JP-A No. 2008-017367 is for appropriately setting the attack time and the release time of the electronic volume in accordance with the input audio signal. Accordingly, this technique is not a technique to maintain constant volume of a digital audio signal that is outputted to the exterior such as to a speaker or the like.

INTRODUCTION TO THE INVENTION

The present disclosure provides a signal processing device that, without leading to an increase in the surface area of a signal processing system circuit, maintains volume constant and can control the adjustment of the attack time and the release time at fine timings.

A first aspect of the present disclosure is a signal processing device including: an amplifying section that, on the basis of a gain set in advance, amplifies a level of an analog signal inputted from an exterior; a pulse width modulation signal generating section that generates a pulse width modulation signal that is a signal obtained by pulse-width modulating the amplified analog signal, by a triangular wave outputted from a triangular wave outputting section; a digital signal processing section that outputs, to an exterior, a digital signal obtained by subjecting the pulse width modulation signal to a predetermined processing; and a gain adjusting section that detects a voltage level of the digital signal or the pulse width modulation signal, and adjusts gain of the amplifying section on the basis of a detected voltage level.

In a second aspect of the present disclosure, in the first aspect, the gain adjusting section may compute an average value of powers of a predetermined time of detected voltage levels, and adjust the gain of the amplifying section in order to vary amplitude of an overall waveform of the digital signal so that a computed average value of powers coincides with a predetermined power target value.

In a third aspect of the present disclosure, in the first aspect, the gain adjusting section may adjust the gain of the amplifying section in order to vary a peak value of a portion of a waveform of the digital signal so that a peak of a detected voltage level coincides with a predetermined peak target value.

In a fourth aspect of the present disclosure, in the above-described aspects, the gain adjusting section may include a clock signal generating section that generates a clock signal, and a detecting section that detects a voltage level of the digital signal on the basis of the clock signal and the digital signal.

In a fifth aspect of the present disclosure, in the fourth aspect, the clock signal generating section may be a phase synchronizing circuit that multiplies the triangular wave.

In accordance with the present disclosure, volume is maintained constant and the adjustment of the attack time and the release time can be controlled at fine timings, without leading to an increase in the surface area of a signal processing system circuit.

BRIEF DESCRIPTION OF THE DRAWINGS

Exemplary embodiments of the present disclosure will be described in detail based on the following figures, wherein.

DETAILED DESCRIPTION

The exemplary embodiments of the present disclosure are described and illustrated below to encompass a signal processing device that adjusts the gain of an analog audio signal, and outputs a digital audio signal that has been converted into a digital signal. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

First Exemplary Embodiment

Figure 1:
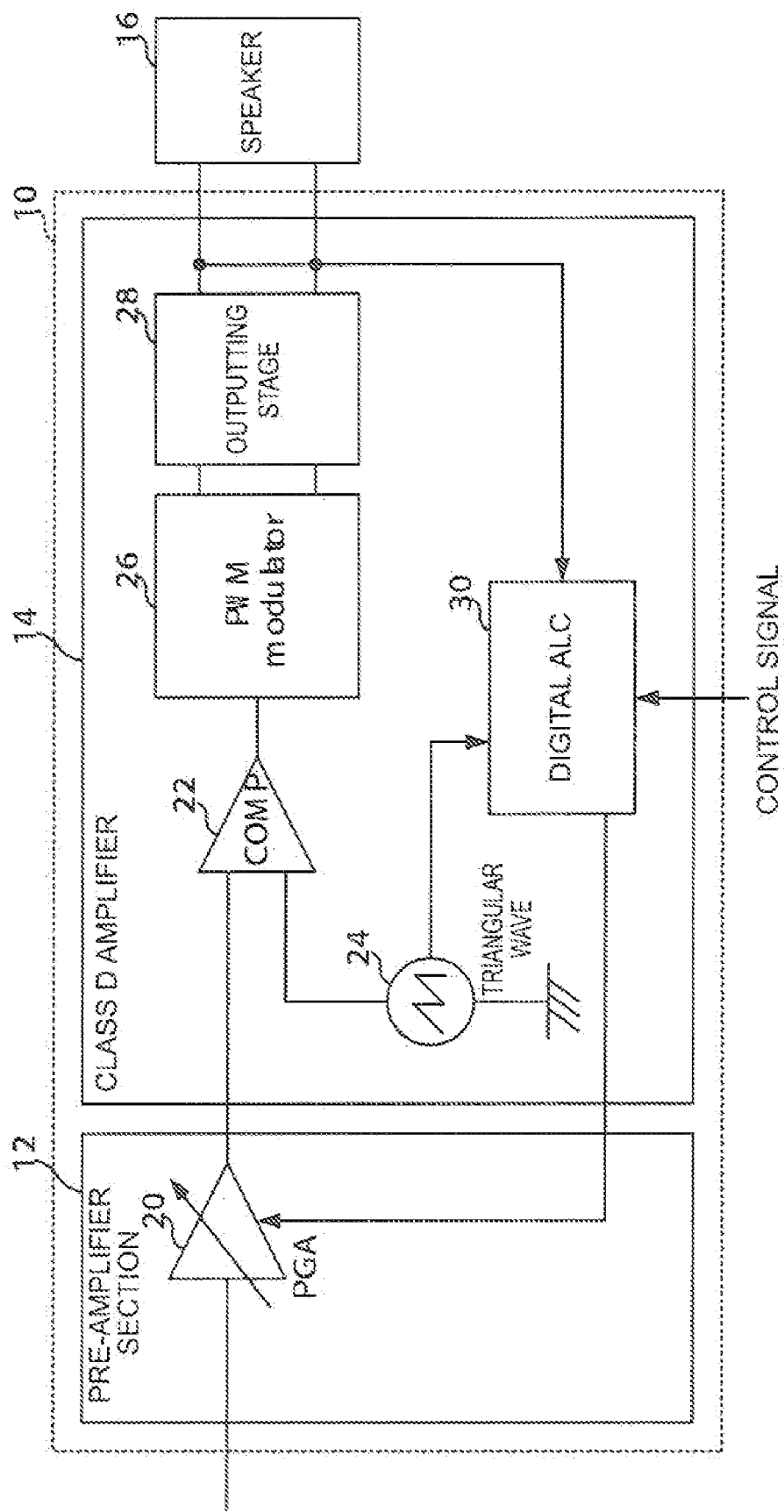
FIG. 1 is a schematic structural drawing showing an example of the schematic structure of a signal processing device relating to a first exemplary embodiment of the present disclosure.

Exemplary embodiments of the present disclosure will be described in detail hereinafter with reference to the drawings. FIG. 1 is a schematic structural drawing showing an example of the schematic structure of a signal processing device of a first exemplary embodiment. A signal processing device 10 of the first exemplary embodiment is structured as an LSI (semiconductor integrated circuit). The signal processing device (LSI) 10 of the first exemplary embodiment has a pre-amplifier section 12 and a class D amplifier 14. The signal processing device (LSI) 10 adjusts the signal level of an analog audio signal that is inputted to the pre-amplifier section 12 from the exterior, and outputs a digital audio signal, that has been converted into a digital signal, to an external speaker 16.

The preamplifier section 12 includes a PGA (Programmable Gain Amplifier, volume circuit) 20. The PGA 20 amplifies the level of an analog audio signal inputted from the exterior, and outputs an analog signal to the class D amplifier 14. The class D amplifier 14 includes a comparator (COMP) 22, a triangular wave generating circuit 24, a PWM modulator 26, an outputting stage 28, and a digital ALC (digital Auto Level Controller, automatic sensitivity adjustment) 30.

Figure 2:
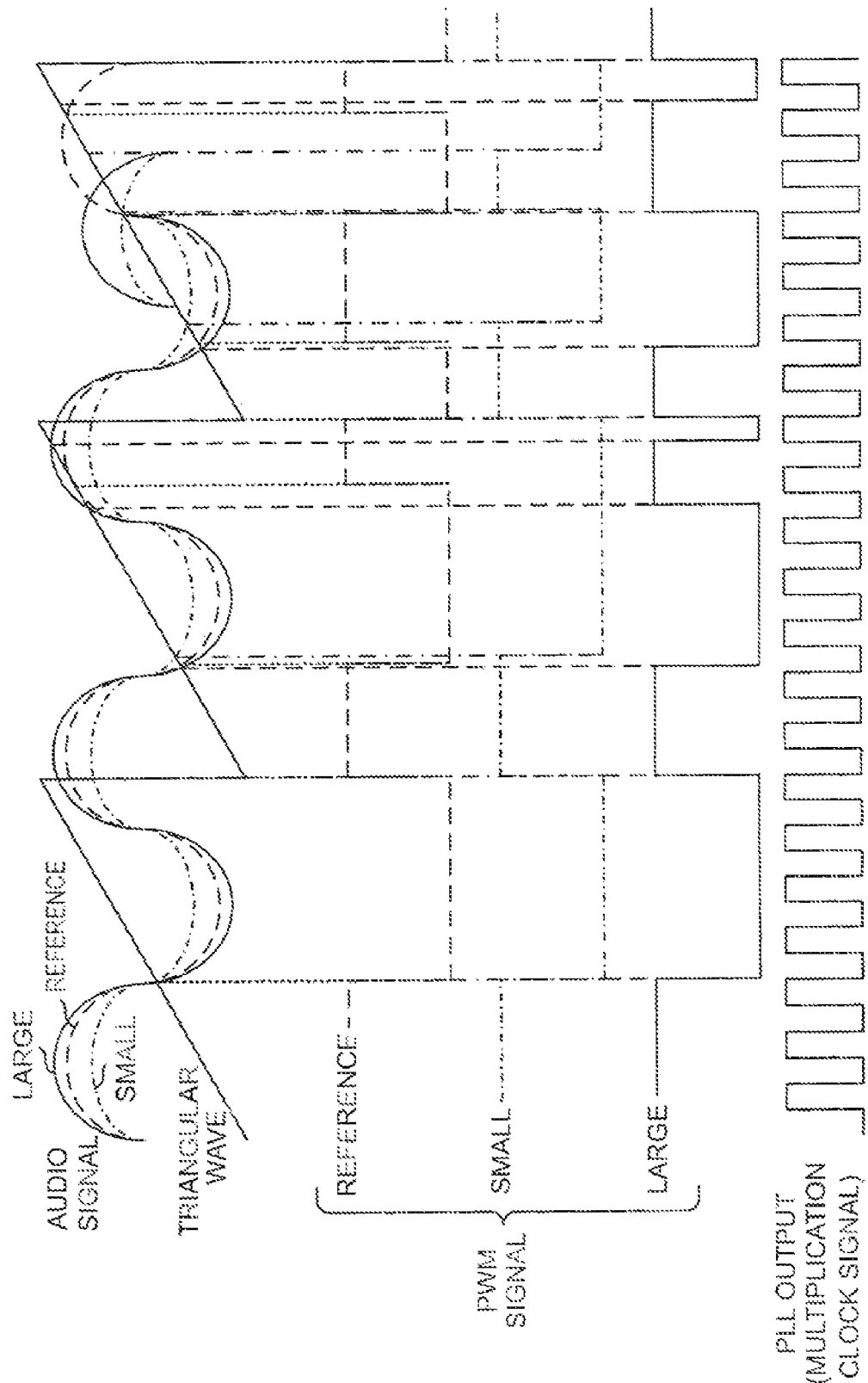
FIG. 2 is an explanatory drawing for explaining concrete examples of a PLL wave and a multiplication clock signal relating to the first exemplary embodiment of the present disclosure.

On the basis of an inputted analog audio signal and a triangular wave generated at the triangular wave generating circuit 24, the COMP 22 carries out pulse-width-modulation and forms a PWM signal that is a digital signal. Concrete examples of the PWM signal of the first exemplary embodiment and a multiplication clock signal (to be described in detail later) that is the PLL output are shown in FIG. 2. The PWM signal of the first exemplary embodiment is a rectangular wave signal that expresses "H" level when the audio signal is larger than the triangular wave, and expresses "L" level when the audio signal is smaller than the triangular wave. When the audio signal is smaller than or is larger than the reference, the PWM signal changes as shown in FIG. 2.

The PWM modulator 26 carries out predetermined digital signal processing on the PWM (Pulse Width Modulation) signal that has been pulse-width-modulated. Sampling rate conversion, over-sampling, noise shaping, and the like, are examples of the predetermined digital signal processing. The outputting stage 28 outputs the digital audio signal, that is obtained by subjecting the PWM signal to the digital signal processing, to the external speaker 16.

Figure 3:
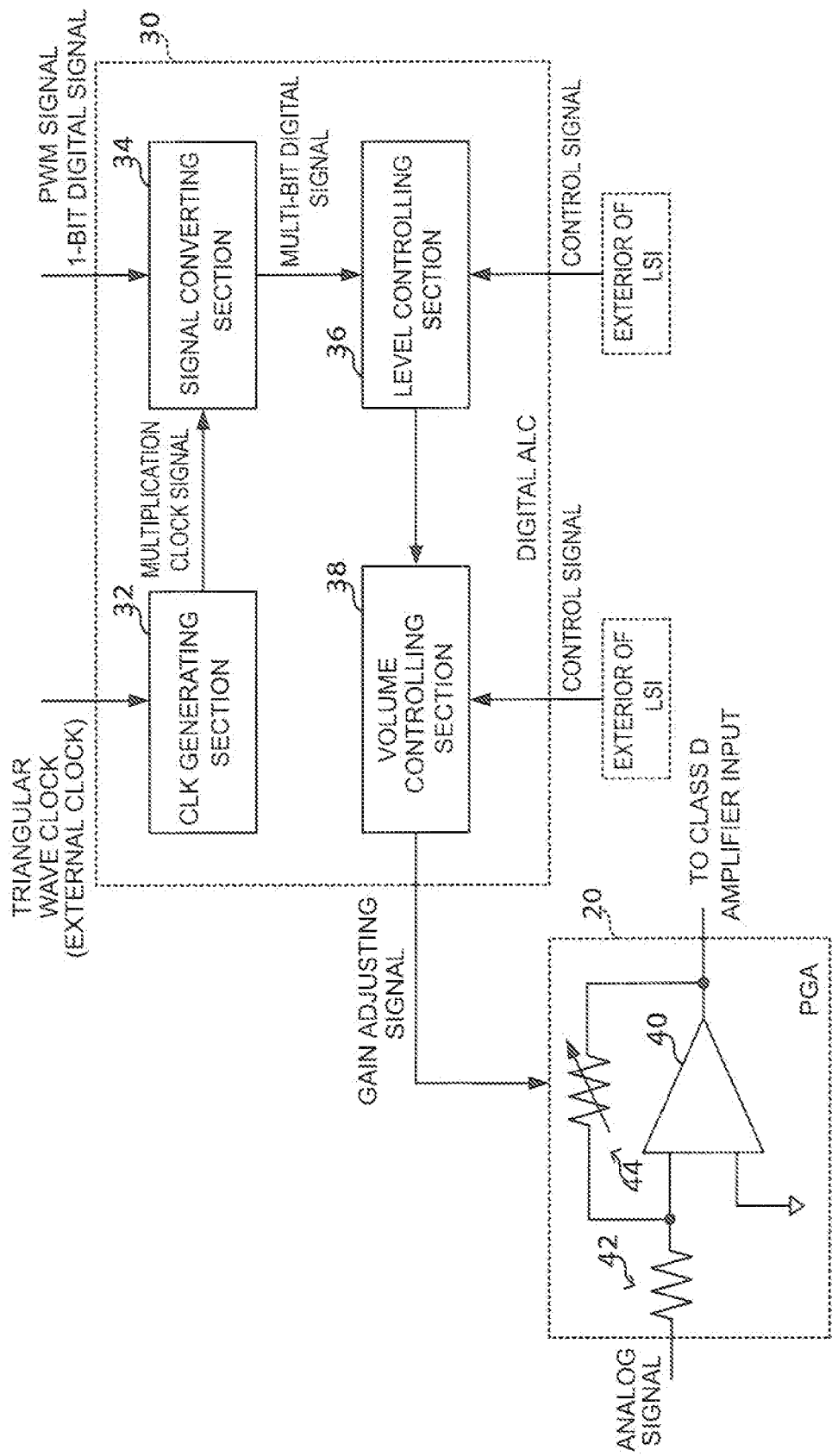
FIG. 3 is a structural drawing showing an example of detailed structures of a PGA and a digital ALC relating to the first exemplary embodiment of the present disclosure.

Operation of the digital ALC 30 of the first exemplary embodiment will be described in detail. The digital ALC 30 of the first exemplary embodiment detects the level of the digital signal outputted from the outputting stage 28. Then, on the basis of the detected level, the ALC 30 adjusts the gain of the PGA 20. FIG. 3 is a structural drawing showing examples of detailed structures of the PGA 20 and the digital ALC 30 of the first exemplary embodiment. The digital ALC 30 of the first exemplary embodiment includes a CLK (Clock) generating section 32, a signal converting section 34, a level controlling section 36 and a volume controlling section 38.

Figure 4:
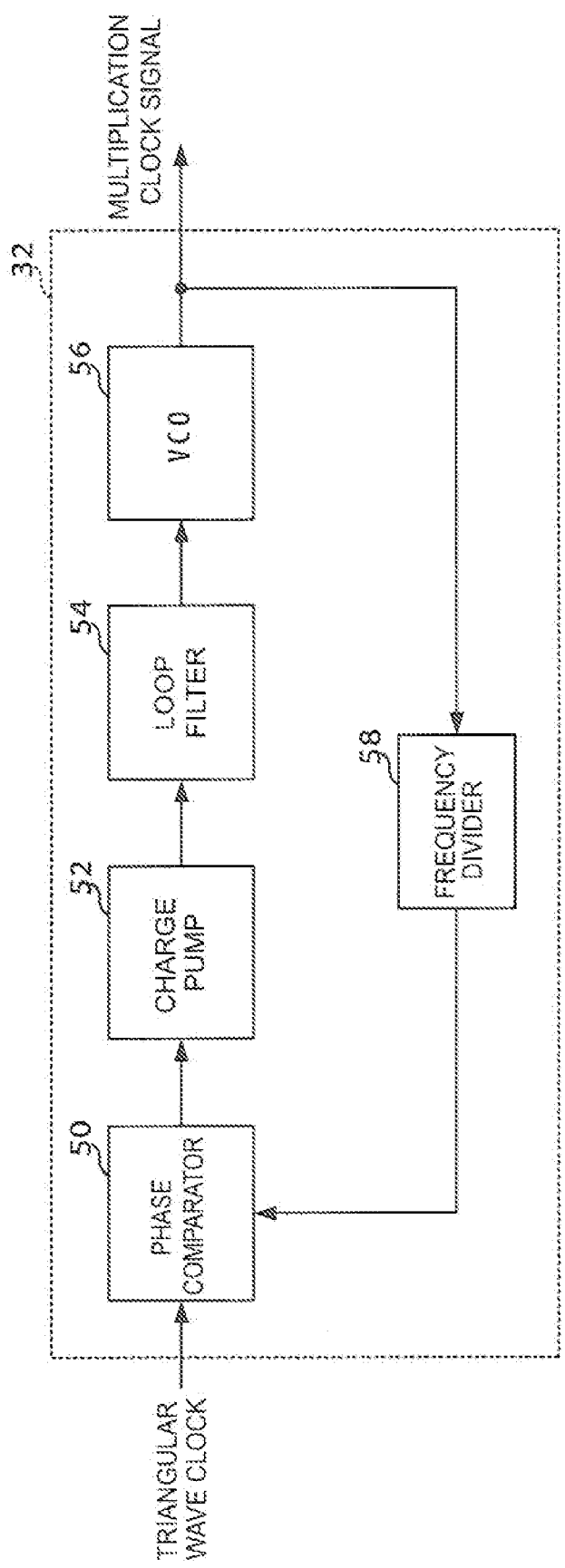
FIG. 4 is a schematic structural drawing showing an example of the schematic structure of a PLL relating to the first exemplary embodiment of the present disclosure.

The CLK generating section 32 generates a multiplication clock signal that is obtained by multiplying the clock of the triangular wave generated at the triangular wave generating circuit 24, and outputs the multiplication clock signal to the signal converting section 34. A PLL (Phase Lock Loop, phase synchronizing circuit) is a concrete example of the CLK generating section 32. An example of the schematic structure of the PLL 32 is shown in FIG. 4. The PLL 32 includes a phase comparator 50, a charge pump 52, a loop filter 54, a VCO (Voltage-Controlled Oscillation circuit) 56 and a frequency divider 58.

The phase comparator 50 outputs the phase difference signal of the inputted triangular wave clock and a signal inputted from the frequency divider 58. The charge pump 52 converts the phase difference signal into voltage, and outputs the voltage. The loop filter 54 is a low-pass filter for phase compensation. The VCO 56 is a circuit that controls the frequency of the output signal (the multiplication clock signal) by the inputted voltage. The frequency divider 58 is a circuit that multiplies the frequency of the inputted signal, and outputs it. Note that, the number of times to multiply the triangular wave is determined in advance, from the error between the audio signal that is inputted from the exterior and a monitor voltage (details of which will be described later). Note that, the more minute the multiplication clock signal (the greater the multiplication number), the smaller the error becomes. However, the more minute the multiplication clock signal, the more time required for processing. Therefore, it is preferable to determine how many times to multiply the triangular wave from a balance between the error and the processing time. A concrete example is approximately $2^6$ times (an error of around 5%) with respect to a frequency of the triangular wave of several hundred kHz.

Note that, in the first exemplary embodiment, a multiplication clock signal, that is obtained by multiplying the triangular wave generated by the triangular wave generating circuit 24, is generated at the CLK generating section 32 and used. However, the clock signal is not limited to the same, and a clock signal of a fast period may be inputted from the exterior of the LSI 10 and the inputted clock signal may be used.

On the basis of the multiplication clock signal inputted from the CLK generating section 32, the signal converting section 34 converts the one-bit digital signal inputted from the outputting stage 28 (the digital audio signal that is obtained by the PWM signal being subjected to digital signal processing) into a multi-bit digital signal, and outputs it.

In the first exemplary embodiment, the PWM signal is fetched at the timing of the multiplication clock and made to be a multi-bit digital signal. Due thereto, the signal processing device of the first exemplary embodiment monitors the voltage of the audio signal.

The level controlling section 36 compares the magnitudes of a target level inputted from the exterior of the semiconductor integrated circuit (LSI) 10 and the voltage value of the multi-bit digital signal. Due thereto, the level controlling section 36 controls the level of the multi-bit digital signal. Note that, the target level is set in advance at an external circuit (not illustrated) or the like of the LSI 10 by a user.

On the basis of a control signal inputted from the exterior of the semiconductor integrated circuit (LSI) 10, the volume controlling section 38 controls the volume of the digital signal. Due thereto, the volume controlling section 38 outputs a gain adjusting signal that adjusts the gain of the PGA 20.

The PGA 20 includes an amplifier 40, a resistor 42, and, at the feedback section of the output, a variable resistor 44. Due to the resistance value of the variable resistor 44 being varied by the gain adjusting signal outputted from the volume controlling section 38, the PGA 20 adjusts the gain that amplifies the analog signal.

Next, control (adjustment) of the digital signal at the level controlling section 36 and the volume controlling section 38 will be described in detail with reference to FIG. 5 and FIG. 6.

Figure 5:
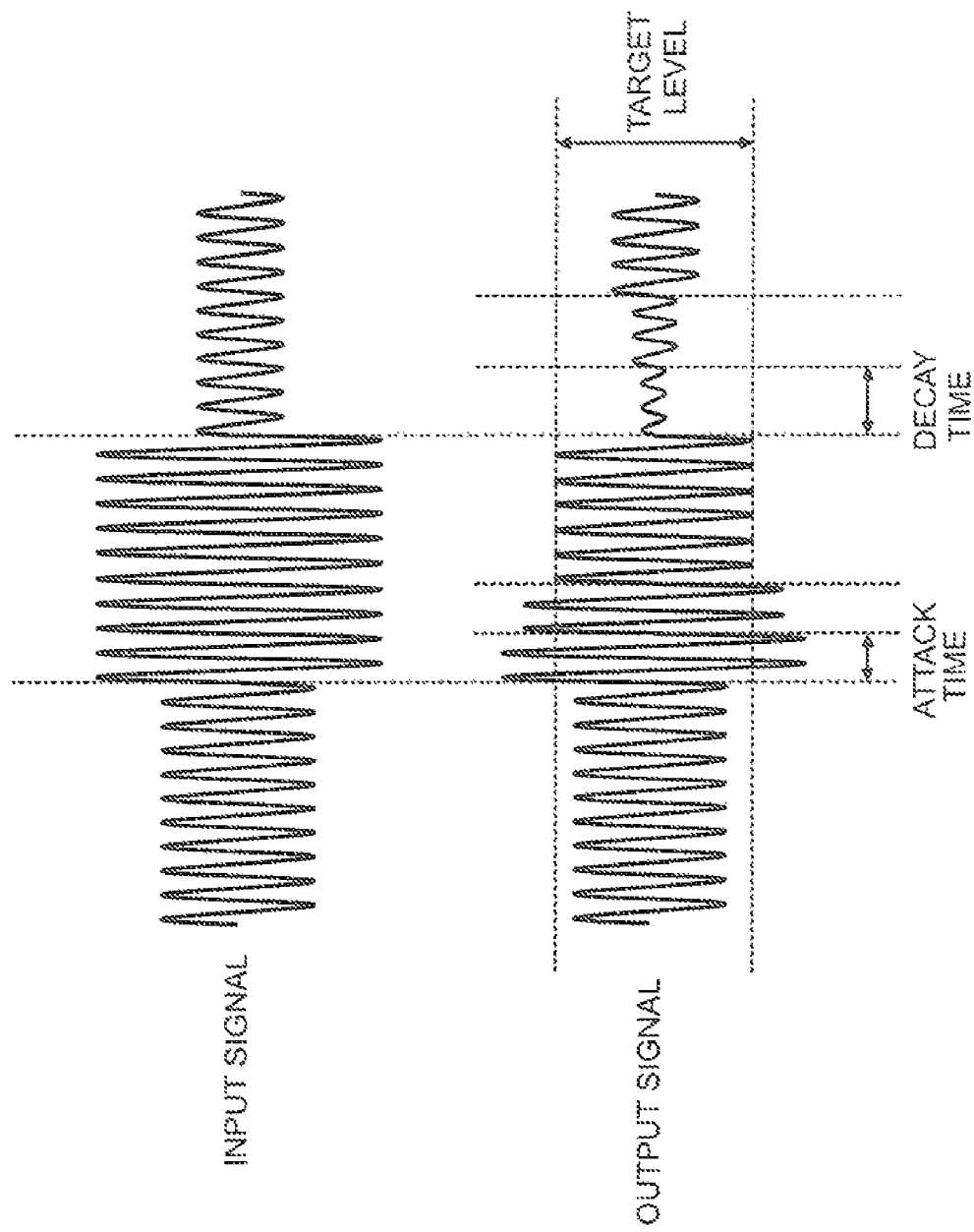
FIG. 5 is a waveform diagram of concrete examples of a waveform of an input signal and a waveform of an output signal, for explaining process of a level controlling section and a volume controlling section when the digital ALC relating to the first exemplary embodiment of the present disclosure is a peak detecting ALC.

FIG. 5 shows concrete examples of a waveform of the input signal of the level controlling section 36 and a waveform of the output signal of the volume controlling section 38, when the digital ALC 30 of the first exemplary embodiment is a peak detecting ALC.

If the peak value of the input signal to the signal processing device 10 is large, the digital ALC 30 of the first exemplary embodiment makes the input signal small, and if the peak value of the input signal to the signal processing device 10 is small, the digital ALC 30 makes the input signal large, so that the output of the signal processing device 10 coincides with the target level. Note, when the target level and all (the input and the output) peak values are made to coincide, the waveform of the input signal and the waveform of the output signal differ greatly. Therefore, at the volume controlling section 38, the attack time and the decay time are set by control signals of attack, decay and the like, that are inputted from the exterior of the LSI 10. In this way, the volume controlling section 38 effects control so that not all of the peak values coincide, but rather, at the attack time, the peak value is larger than the target level, and, at the decay time, the peak value is smaller than the target level. The volume controlling section 38 outputs, to the PGA 20, a gain adjusting signal for adjusting the gain of the PGA 20 so that the output signal becomes the waveform as shown in FIG. 5. In this way, at the peak detecting ALC, control is carried out by setting the attack time and the decay time. Therefore, the signal processing device 10 of the first exemplary embodiment can prevent saturation of the waveform.

Figure 6:
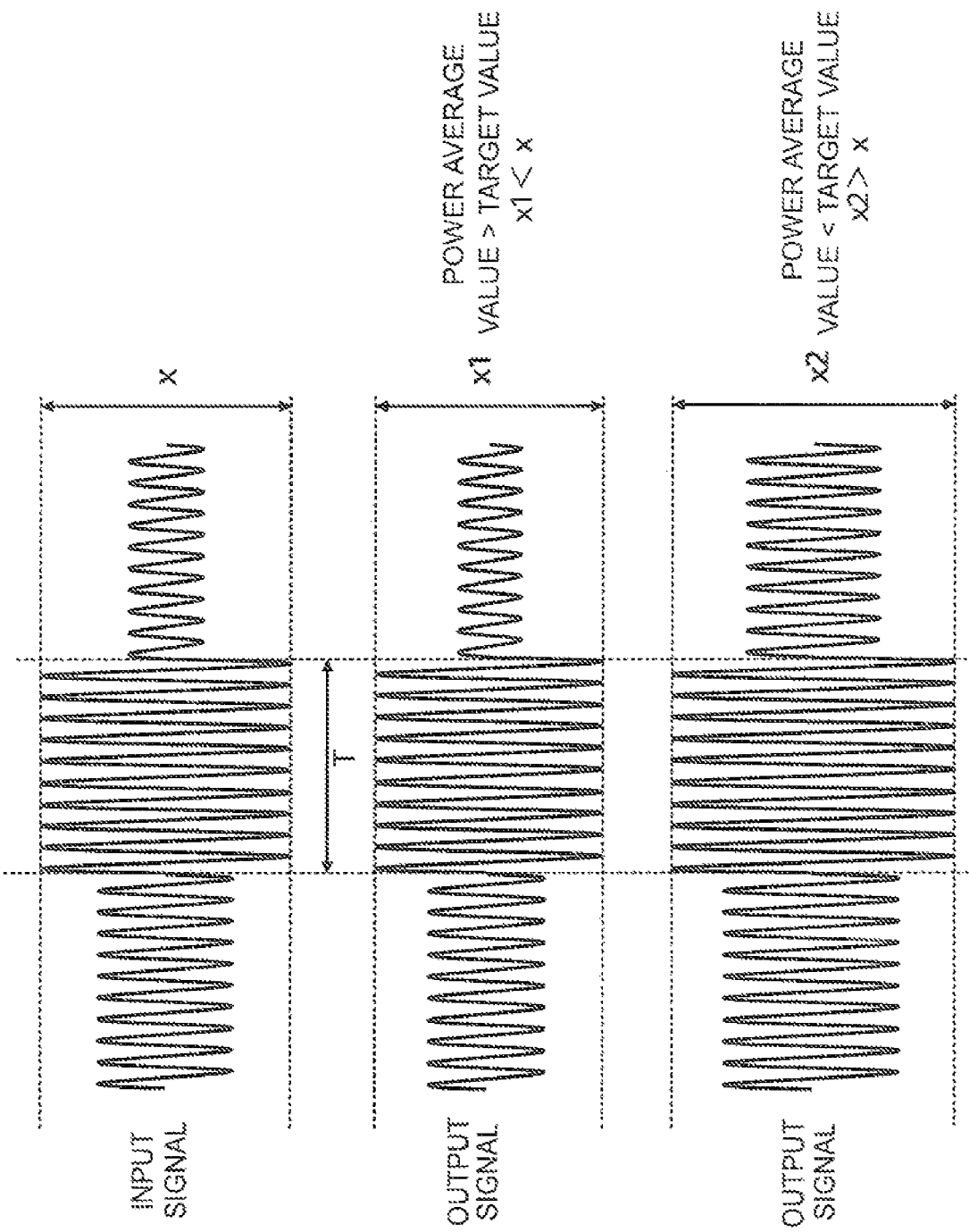
FIG. 6 is a waveform diagram of concrete examples of a waveform of an input signal and waveforms of an output signal, for explaining process of the level controlling section and the volume controlling section when the digital ALC relating to the first exemplary embodiment of the present disclosure is a power detecting ALC.

FIG. 6 shows concrete examples of a waveform of the input signal of the level controlling section 36 and waveforms of the output signal of the volume controlling section 38, when the digital ALC 30 of the first exemplary embodiment is a power detecting ALC.

Figure 7:
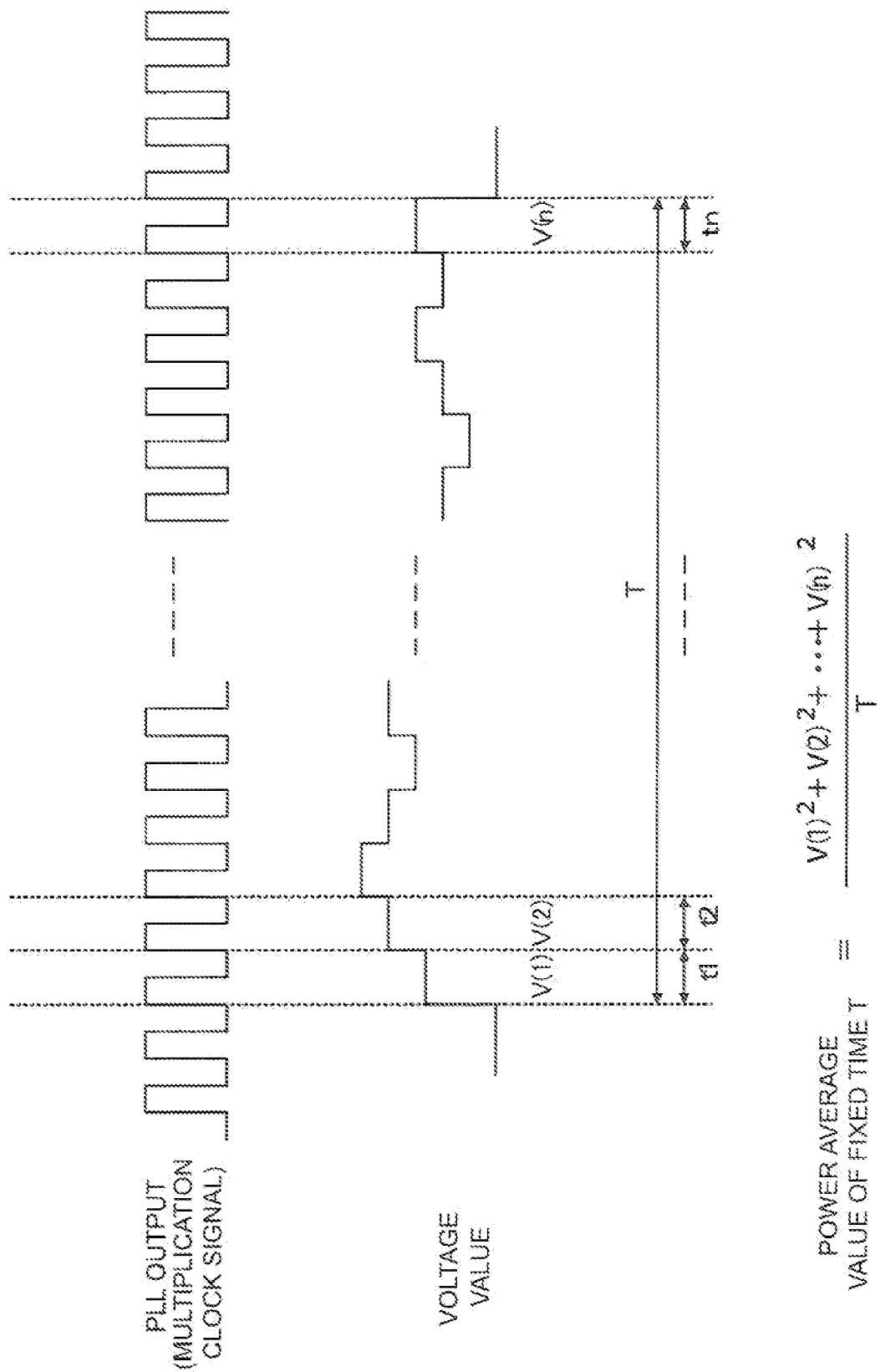
FIG. 7 is an explanatory drawing for explaining computing of the average value of powers of voltages at the power detecting ALC relating to the first exemplary embodiment of the present disclosure.

The digital ALC 30 of the first exemplary embodiment computes the average value of the powers of the voltage values in a predetermined fixed time, and, by varying the amplitude of the input signal such that the average power coincides with a predetermined average power, changes the waveform overall. Computation of the average power of the voltage values of the first exemplary embodiment will be described in detail with reference to FIG. 7. Given that the voltage values of times t1 through tn, that are based on timings of the multiplication clock signal in a fixed time T, are voltage values V(1) through V(n) (where n is an integer greater than or equal to 1), the average value of the power of the fixed time T is computed by the formula of FIG. 7.

As shown in FIG. 6, when the average value of the power is greater than a target value, the digital ALC 30 of the first exemplary embodiment makes amplitude x1 of the waveform overall be smaller than amplitude x of the input signal. On the other hand, when the average value of the power is smaller than the target value, the digital ALC 30 of the first exemplary embodiment makes amplitude x2 of the waveform overall be smaller than the amplitude x of the input signal. The volume controlling section 38 outputs, to the PGA 20, a gain adjusting signal for adjusting the gain of the PGA 20 so that the output signal becomes a waveform of an amplitude as shown in FIG. 6. In this way, the power detecting ALC varies the overall waveform of the input signal. Therefore, at the signal processing device (LSI) 10 of the first exemplary embodiment, a natural sound with respect to the input signal can be output.

As described above, at the signal processing device (LSI) 10 of the first exemplary embodiment, the CLK generating section 32 of the digital ALC 30 that is provided at the class D amplifier 14 that generates the multiplication clock signal that is obtained by multiplying the triangular wave generated by the triangular wave generating circuit 24. Next, at the signal converting section 34, the signal processing device (LSI) 10 of the first exemplary embodiment converts, on the basis of the multiplication clock signal, the one-bit digital audio signal outputted from the outputting stage 28 into a multi-bit digital signal, and monitors the voltage value of the input signal. Then, at the level controlling section 36, the signal processing device (LSI) 10 of the first exemplary embodiment controls the voltage level on the basis of the target level inputted from the exterior of the LSI 10. Moreover, at the volume controlling section 38, the signal processing device (LSI) 10 of the first exemplary embodiment, outputs a gain adjusting signal to the PGA 20 so as to vary the waveform of the input signal on the basis of the control signal inputted from the exterior of the LSI 10. The PGA 20 adjusts the gain by varying the resistance value of the variable resistor 44. Next, the PGA 20 amplifies the analog audio signal inputted from the exterior, by the adjusted gain. Further, the PGA 20 outputs the amplified audio signal to the inputting section (the COMP 22) of the class D amplifier.

Figure 9:
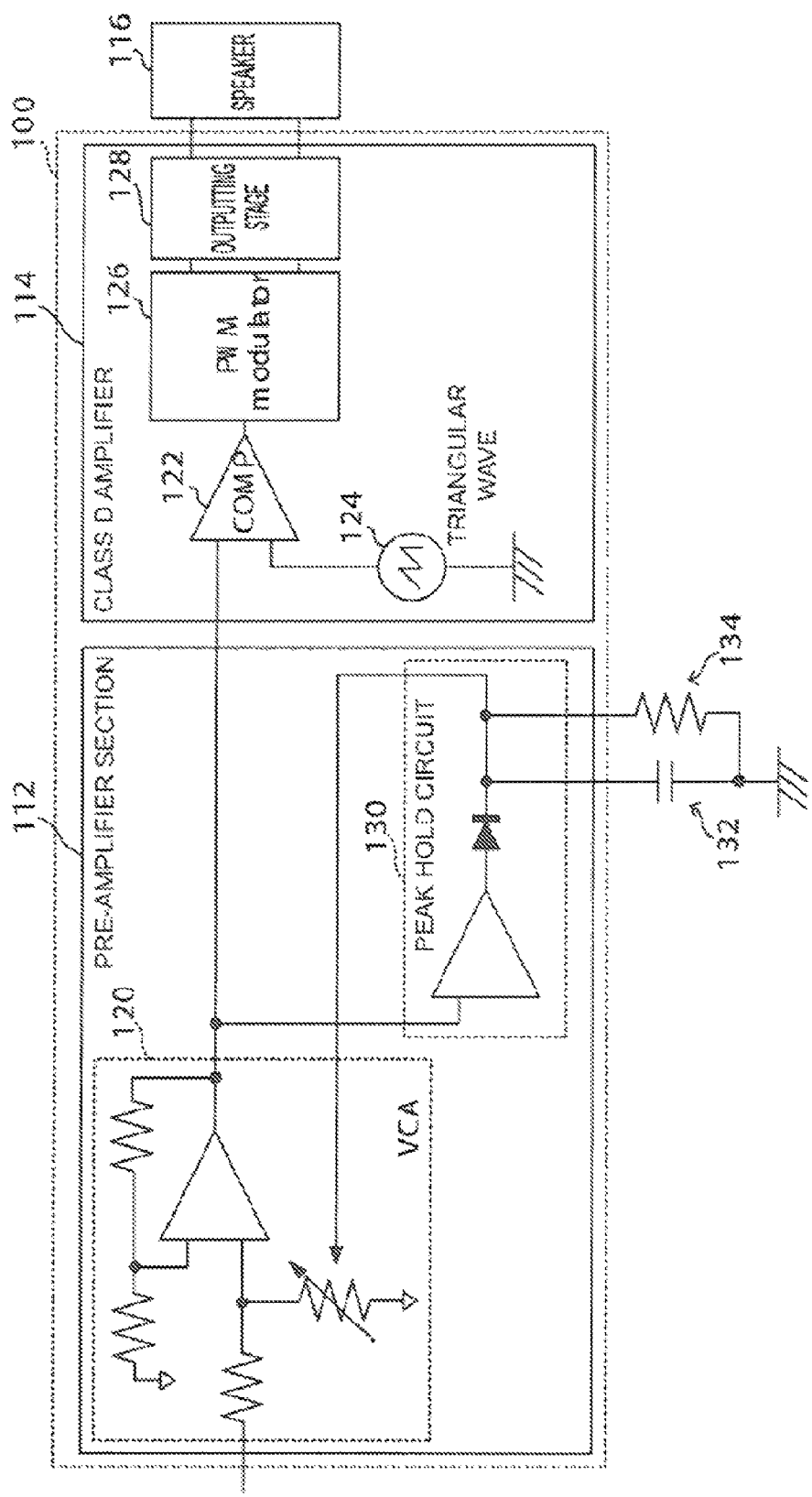
FIG. 9 is a schematic structural drawing showing an example of the schematic structure of a conventional signal processing device.

In this way, the signal processing device 10 of the first exemplary embodiment, does not use externally-attached parts such as, for example, the capacitor 132 used by the conventional peak hold circuit 130 shown in FIG. 9, or the like. Therefore, the signal processing device 10 of the first exemplary embodiment can maintain the volume constant without leading to an increase in the surface area of the overall signal processing system circuit. Further, the digital ALC 30 can set the attack time, the release time, and the like on the basis of the digital signal. Therefore, the signal processing device 10 of the first exemplary embodiment can easily and finely control the setting of the attack time, the release time and the like.

By making the digital ALC 30 be a peak detecting ALC, the signal processing device 10 of the first exemplary embodiment can prevent saturation of the waveform. Further, by making the digital ALC 30 be a power detecting ALC, the signal processing device 10 of the first exemplary embodiment can output a natural sound with respect to the input signal.

Note that the signal processing device 10 of the first exemplary embodiment outputs a digital audio signal to the speaker 16. However, the present exemplary embodiment is not limited to the same, and it suffices for the signal processing device 10 of the first exemplary embodiment to amplify an analog audio signal inputted from the exterior, digitally convert it, and output the digital audio signal to an external speaker or recording device.

Second Exemplary Embodiment

Figure 8:
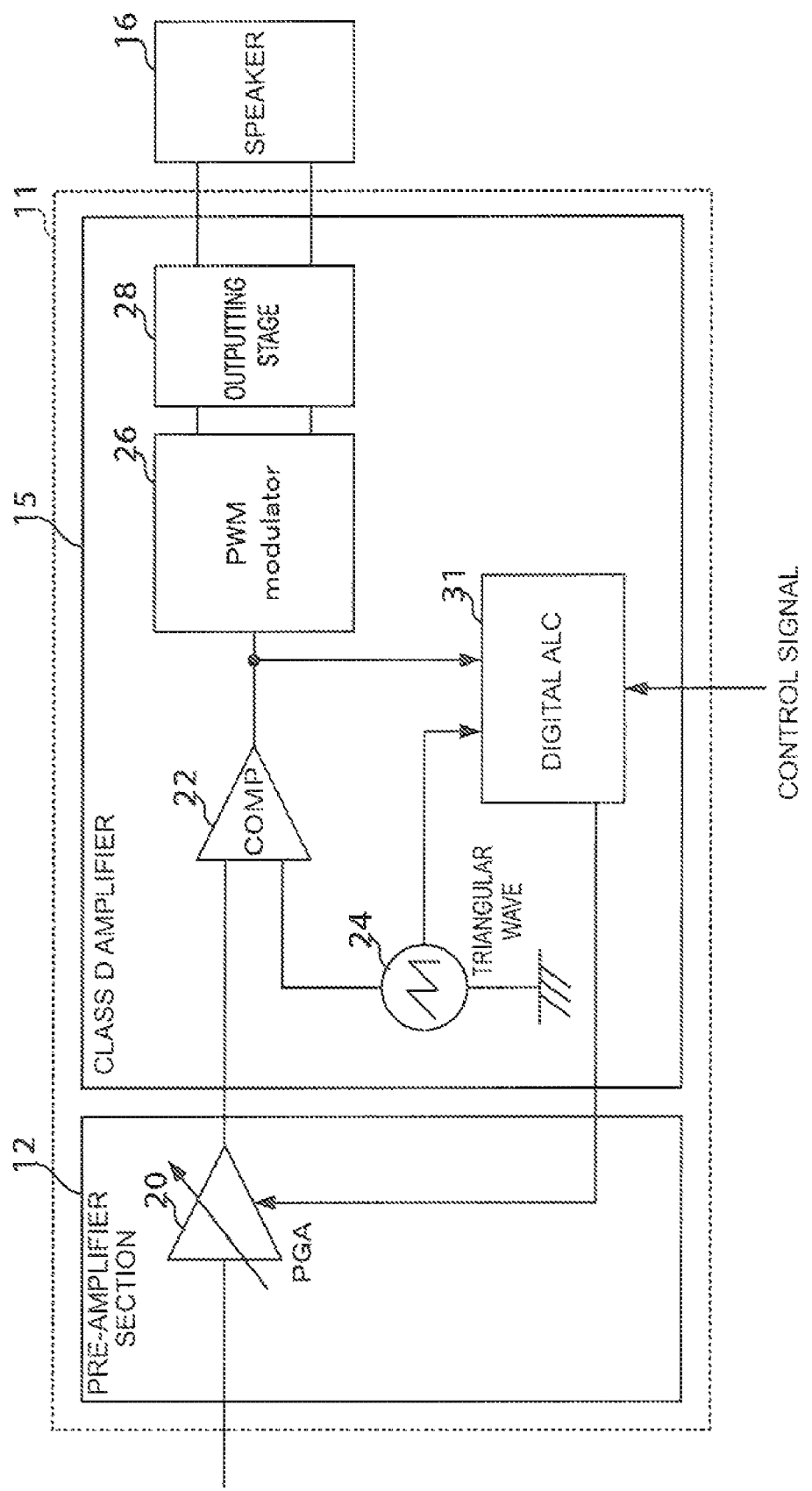
FIG. 8 is a schematic structural drawing showing an example of the schematic structure of a signal processing device relating to a second exemplary embodiment of the present disclosure.

An exemplary embodiment of the present disclosure will be described in detail hereinafter with reference to the drawings. FIG. 8 is a schematic structural drawing showing an example of the schematic structure of a signal processing device relating to a second exemplary embodiment. Note that, the second exemplary embodiment has a structure and operations that are substantially similar to those of the first exemplary embodiment. Accordingly, portions that are the same as those of the first exemplary embodiment are denoted by the same reference numerals, and detailed description thereof is omitted.

A class D amplifier 15 of a signal processing device 11 of the second exemplary embodiment has a digital ALC 31. The signal processing device 11 converts a PWM signal, that is a one-bit digital signal outputted from the COMP 22, into a multi-bit digital signal at the signal converting section 34 of the digital ALC 31. Namely, on the basis of the PWM signal outputted from the COMP 22, the signal processing device 11 generates, at the digital ALC 31, an adjusting signal that adjusts the gain of the PGA.

In addition to effects that are similar to those of the signal processing device 10 of the first exemplary embodiment, the signal processing device 11 of the second exemplary embodiment utilizes the output of the COMP 22. Therefore, the signal processing device 11 of the second exemplary embodiment can carry out adjustment of the gain of the PGA more quickly.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A signal processing device comprising:
an amplifying section that, on the basis of a gain set in advance, amplifies a level of an analog signal inputted from an exterior;
a pulse width modulation signal generating section that generates a pulse width modulation signal that is a signal obtained by pulse-width modulating the amplified analog signal, by a triangular wave outputted from a triangular wave outputting section;
a digital signal processing section that outputs a digital signal obtained by subjecting the pulse width modulation signal to a predetermined processing, the predetermined processing including controlling a voltage level of the digital signal based, at least in part, on the gain set in advance; and
a gain adjusting section that detects the voltage level of the digital signal or the pulse width modulation signal, and adjusts gain of the amplifying section on the basis of a detected voltage level and a control signal.

2. The signal processing device of claim 1, wherein the gain adjusting section computes an average value of powers of a predetermined time of detected voltage levels, and adjusts the gain of the amplifying section in order to vary amplitude of an overall waveform of the digital signal so that a computed average value of powers coincides with a predetermined power target value.

3. The signal processing device of claim 1, wherein the gain adjusting section adjusts the gain of the amplifying section in order to vary a peak value of a portion of a waveform of the digital signal so that a peak of a detected voltage level coincides with a predetermined peak target value.

4. The signal processing device of claim 1, wherein the gain adjusting section includes:
a clock signal generating section that generates a clock signal; and
a detecting section that detects a voltage level of the digital signal on the basis of the clock signal and the digital signal.

5. The signal processing device of claim 4, wherein the clock signal generating section is a phase synchronizing circuit that multiplies the triangular wave.

* * * * *